(12) United States Patent
Huang et al.

(10) Patent No.: US 12,342,529 B2
(45) Date of Patent: Jun. 24, 2025

(54) SEMICONDUCTOR STRUCTURE AND MANUFACTURING METHOD THEREOF AND MEMORY

(71) Applicant: CHANGXIN MEMORY TECHNOLOGIES, INC., Hefei (CN)

(72) Inventors: Juanjuan Huang, Hefei (CN); Weiping Bai, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 358 days.

(21) Appl. No.: 17/884,007

(22) Filed: Aug. 9, 2022

(65) Prior Publication Data

US 2023/0328959 A1 Oct. 12, 2023

Related U.S. Application Data

(63) Continuation of application No. PCT/CN2022/099562, filed on Jun. 17, 2022.

(30) Foreign Application Priority Data

Apr. 11, 2022 (CN) .......................... 202210376236.X

(51) Int. Cl.
| | |
|---|---|
| *H10B 12/00* | (2023.01) |
| *G11C 5/06* | (2006.01) |
| *H01L 21/02* | (2006.01) |

(52) U.S. Cl.
CPC .......... *H10B 12/315* (2023.02); *G11C 5/063* (2013.01); *H01L 21/02636* (2013.01);
(Continued)

(58) Field of Classification Search
CPC .. H10B 12/315; H10B 12/0335; H10B 12/05; H10B 12/482; H10B 12/033;
(Continued)

(56) References Cited

U.S. PATENT DOCUMENTS

| | | | |
|---|---|---|---|
| 6,051,468 | A | 4/2000 | Hshieh |
| 7,026,209 | B2 | 4/2006 | Wang |

(Continued)

FOREIGN PATENT DOCUMENTS

| | | |
|---|---|---|
| CN | 1599070 A | 3/2005 |
| CN | 112951770 A | 6/2021 |

(Continued)

OTHER PUBLICATIONS

J.A. Kittl et al. "High-k dielectrics for future generation memory devices (Invited Paper)", Microelectronic Engineering vol. 86 (2009), pp. 1789-1795.

*Primary Examiner* — David Vu
(74) *Attorney, Agent, or Firm* — Syncoda LLC; Feng Ma

(57) ABSTRACT

A semiconductor structure includes: a plurality of transistors located in a semiconductor layer; each of the transistors including a semiconductor body extending in a first direction and a gate structure covering at least one side surface of the semiconductor body; the first direction being a thickness direction of the semiconductor layer; a plurality of conductive pillars, each of the conductive pillars being located on a top surface of a corresponding semiconductor body and being in direct contact with the corresponding semiconductor body; a memory structure covering the plurality of conductive pillars.

15 Claims, 21 Drawing Sheets

(52) U.S. Cl.
CPC ......... *H10B 12/0335* (2023.02); *H10B 12/05* (2023.02); *H10B 12/482* (2023.02)

(58) Field of Classification Search
CPC ... G11C 5/063; H01L 21/02636; H01L 28/90; H01L 29/42392; H01L 29/78642
See application file for complete search history.

(56) References Cited

U.S. PATENT DOCUMENTS

| | | |
|---|---|---|
| 2004/0115884 A1 | 6/2004 | Wang |
| 2019/0296155 A1* | 9/2019 | Sawabe ............. H01L 29/66969 |
| 2021/0391330 A1 | 12/2021 | Zhu et al. |
| 2022/0037459 A1 | 2/2022 | Lu et al. |

FOREIGN PATENT DOCUMENTS

| | | |
|---|---|---|
| CN | 114068811 A | 2/2022 |
| CN | 114256240 A | 3/2022 |
| WO | 2021218882 A1 | 11/2021 |

* cited by examiner

SEMICONDUCTOR STRUCTURE AND MANUFACTURING METHOD THEREOF AND MEMORY

CROSS-REFERENCE OF RELATED APPLICATIONS

The present application is a U.S. continuation application of International Application No. PCT/CN2022/099562, filed on Jun. 17, 2022, which claims priority to Chinese Patent Application No. 202210376236.X, filed on Apr. 11, 2022. International Application No. PCT/CN2022/099562 and Chinese Patent Application No. 202210376236.X are incorporated herein by reference in their entireties.

BACKGROUND

The memory array architecture of a Dynamic Random Access Memory (DRAM) is an array composed of memory cells, each of which includes a transistor and a capacitor (i.e. 1T1C memory cell). The gate of the transistor is connected to the word line, the drain is connected to the bit line, and the source is connected to the capacitor.

As the size of dynamic random access memory shrinks, so does the size of the capacitor. How to ensure the performance of the capacitors in a dynamic random access memory has become an urgent problem to be solved.

SUMMARY

According to a first aspect of the disclosure, a semiconductor structure is provided, which includes:
  a plurality of transistors located in a semiconductor layer; each of the transistors including a semiconductor body extending in a first direction and a gate structure covering at least one side surface of the semiconductor body; the first direction being a thickness direction of the semiconductor layer;
  a plurality of conductive pillars, each of the conductive pillars being located on a top surface of a corresponding semiconductor body and being in direct contact with the corresponding semiconductor body; and
  a memory structure covering the plurality of conductive pillars.

According to another aspect of the disclosure, a memory is provided, which includes a semiconductor structure as described in any of the above-described various embodiments of the disclosure.

According to yet another aspect of the disclosure, a manufacturing method for a semiconductor structure is provided, which includes:
  providing a semiconductor layer;
  forming a plurality of transistors in the semiconductor layer; each of the transistors including a semiconductor body extending in a first direction and a gate structure covering at least one side surface of the semiconductor body; the first direction being a thickness direction of the semiconductor layer;
  forming conductive pillars on exposed top surfaces of corresponding semiconductor bodies; and
  forming a memory structure covering the conductive pillars.

Figure 1A:
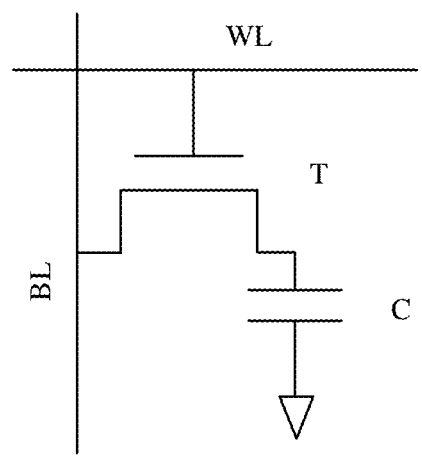
FIG. 1A is a schematic diagram of the circuit connection of a DRAM transistor provided by embodiments of the disclosure.

In the above accompanying drawings (which may not be drawn to scale), the similar reference numerals may describe similar components in different views. The similar reference numerals with different letter suffixes may denote different examples of similar components. The drawings generally illustrate, by way of examples, and not limitation, various embodiments discussed herein.

DETAILED DESCRIPTION

The disclosure relates to, but is not limited to, a semiconductor structure and a manufacturing method thereof, and a memory.

In order to make the technical solution and advantages of the embodiments of the disclosure clearer, the technical solution of the disclosure will be described in detail below with reference to the accompanying drawings and embodiments. Although exemplary embodiments of the present disclosure are shown in the drawings, it should be understood that the present disclosure may be implemented in various forms and should not be limited to the specific embodiments set forth herein. These embodiments are provided for the purpose that the disclosure will be more thoroughly understood and the scope of the disclosure will be fully conveyed to those skilled in the art.

The disclosure is described more specifically by way of example in the following paragraphs with reference to the accompanying drawings. The advantages and features of the disclosure will become clearer according to the following description and claims. It should be noted that, the drawings are all in very simplified form and use imprecise proportions for convenience and clarity only to aid in illustrating the purpose of the embodiments of the disclosure.

It should be understood that the meanings of "on", "over" and "above" in the disclosure should be interpreted in the widest manner so that "on" not only means its meaning of "on" something without intermediate features or layers therebetween (i.e. directly on something), but also includes "on" something with intermediate features or layers therebetween.

In addition, for convenience in description, spatial relative terms such as "on", "over", "above", "up", "upper" and the like may be used herein to describe the relationship of one element or feature to another element or feature as shown. Spatially relative terms are intended to encompass different orientations of the device in use or operation in addition to the orientation depicted in the figures. The device may be oriented in other ways (rotated for 90 degrees or in other orientations) and similarly the spatial relative descriptors used herein may be interpreted accordingly.

In embodiments of the disclosure, the term "substrate" refers to a material to which a subsequent layer of a material is added. The substrate itself may be patterned. The material added to the top of the substrate may be patterned or may remain unpatterned. In addition, the substrate may include various semiconductor materials, such as silicon, silicon germanium, germanium, gallium arsenide, indium phosphide, or the like. Alternatively, the substrate may be made of a non-conductive material such as glass, plastic or sapphire wafer.

In embodiments of the disclosure, the term "layer" refers to a part of material of a region with a thickness. A layer may extend over the entirety of a lower or upper structure, or may have a range smaller than the range of the lower or upper structure. Further, a layer may be a region of a homogeneous or heterogeneous continuous structure whose thickness is less than the thickness of a continuous structure. For example, a layer may be located between the top and the bottom surfaces of a continuous structure or a layer may be located between any horizontal surface at the top and bottom surfaces of a continuous structure. A layer may extend horizontally, vertically, and/or along an inclined surface. A layer may include a plurality of sub-layers. For example, an interconnect layer may include one or more conductor and contact sub-layers in which interconnect lines and/or via contacts are formed, and one or more dielectric sub-layers.

In embodiments of the disclosure, terms "first", "second", or the like are used to distinguish similar objects, and need not be used to describe a specific order or priority.

A semiconductor structure involved in embodiments of the disclosure is at least a part of a device structure that will be configured for a subsequent process to form a final device structure. Here the final device may include a memory including but not limited to dynamic random access memory which is described below only as an example.

It should be noted however that the description of the following embodiments with respect to dynamic random access memory is intended only to illustrate the disclosure and is not intended to limit the protection scope of the disclosure.

With the development of dynamic random access memory technology, the size of memory cells is getting smaller and smaller, and its array architecture is changed from $8F^2$ to $6F^2$ and then to $4F^2$. In addition, based on the requirement for ion and leakage current in a dynamic random access memory, the memory architecture changes from planar array transistor to recess gate array transistor, then from recess gate array transistor to buried channel array transistor, and then from buried channel array transistor to vertical channel array transistor.

In some embodiments of the disclosure, whether it is a planar transistor or a buried transistor, a DRAM is composed of a plurality of memory cell structures, and each memory cell structure is mainly composed of a transistor and a memory cell (memory capacitor) controlled by the transistor, that is, the DRAM includes an architecture with one transistor (T) and one capacitor (C) (1T1C).

Figure 1B:
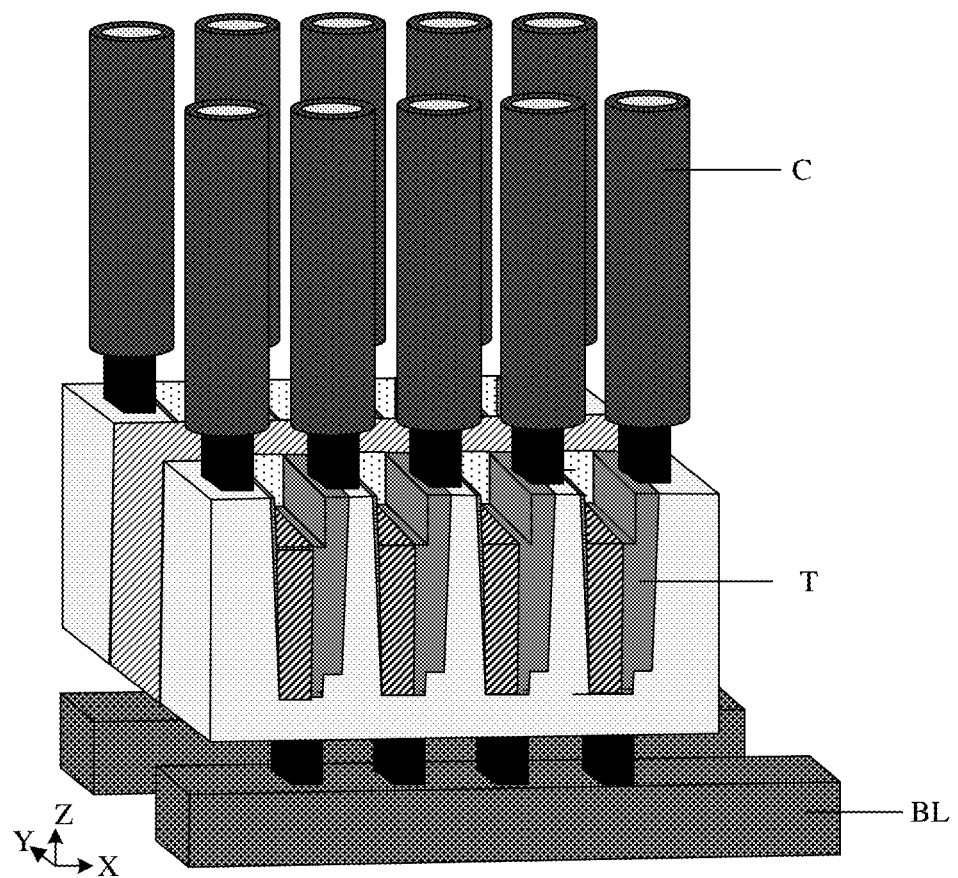
FIG. 1B is a schematic structural diagram of a memory provided by embodiments of the disclosure.

FIG. 1A is a schematic diagram of a control circuit with a 1T1C architecture provided in embodiments of the disclosure, and FIG. 1B is a schematic structural diagram of a DRAM memory array formed by transistors with a 1T1C architecture provided in embodiments of the disclosure. As shown in FIGS. 1A and 1B, the drain of the transistor T is electrically connected with the bit line (BL), the source area of the transistor T is electrically connected with one of the electrode plates of the capacitor C, and the other electrode plate of the capacitor C may be connected with a reference voltage, which can be ground voltage or other voltage, and the gate of the transistor T is connected with a word line (WL). A voltage is applied through the word line WL to control the transistor T to turn on or off, and the bit line BL is configured to perform a read or write operation on the transistor T when the transistor T is turned on.

Figure 2A:
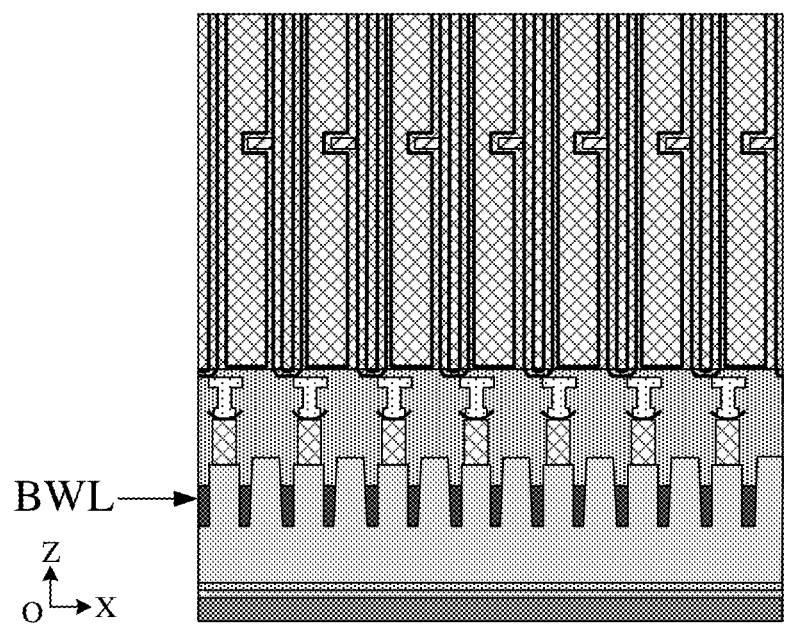
FIG. 2A is a schematic diagram of the arrangement of a buried gate structure provided by embodiments of the present disclosure.
Figure 2B:
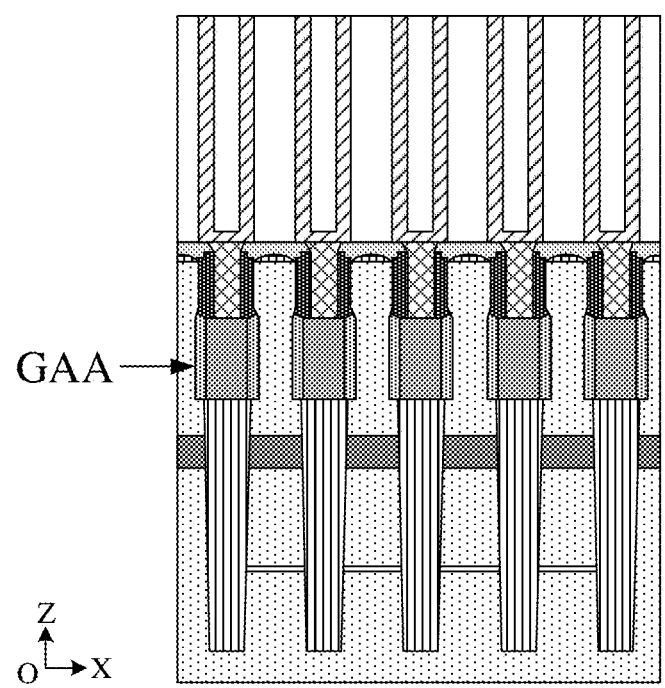
FIG. 2B is a schematic diagram of the arrangement of a gate all around structure provided by embodiments of the disclosure.
Figure 2C:
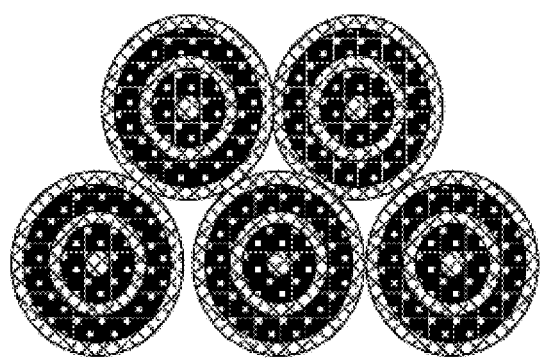
FIG. 2C is a schematic diagram of a hexagonal closest packed structure provided by embodiments of the disclosure.
Figure 2D:
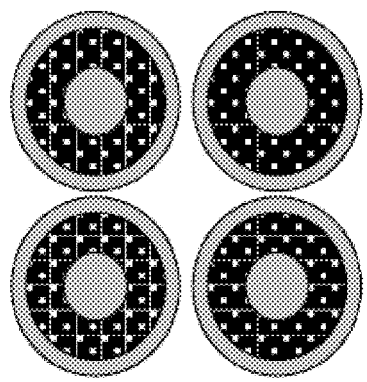
FIG. 2D is a schematic diagram of a quadrilateral packed structure provided by embodiments of the disclosure.

With the increasing integration of electronic products, the size of dynamic random access memory is increasingly reduced, and its memory cell array has developed from a buried word line (BWL) structure arrangement (referring to FIG. 2A) to a gate all around (GAA) structure arrangement with smaller occupied area (referring to FIG. 2B). At the same time, the size of the capacitors in a DRAM has also adjusted, from hexagonal closest packed (refer to FIG. 2C) to quadrilateral packed (refer to FIG. 2D); the radius of the capacitors also becomes smaller, and it retreats from the cup structure to the columnar structure.

In order to increase the size of the capacitor, i.e., the surface area between the capacitor electrode and the dielectric layer, so as to improve the storage capacity of the memory, on the one hand, the height of the capacitor can be increased, but the increase of the height of the capacitor will cause a higher aspect ratio, this structure with a larger aspect ratio will increase the process difficulty, which in turn limits the height of the capacitor; on the other hand, a manner of stacking a plurality of capacitors can be adopted, however, in the process of stacking capacitors, it is difficult to align the plurality of capacitors.

Figure 3:
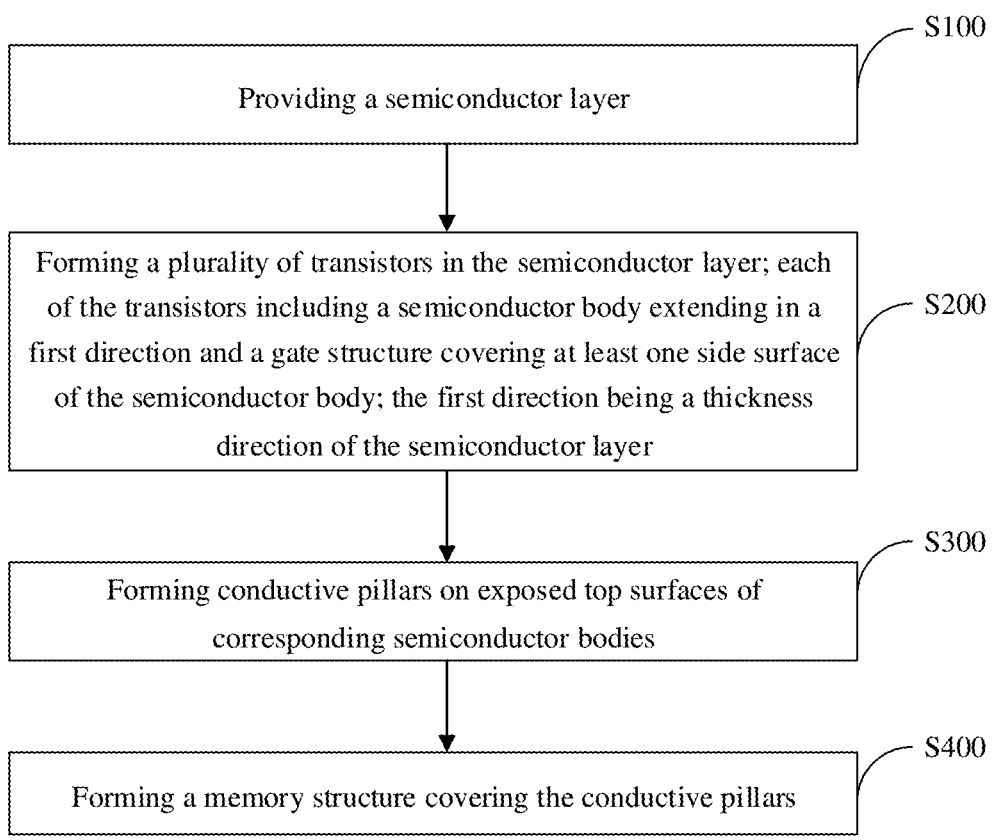
FIG. 3 is a flow chat of a manufacturing method for a semiconductor structure provided by embodiments of the disclosure.

In view of this, in order to solve one or more of the above problems, embodiments of the disclosure provide a manufacturing method for a semiconductor structure, so as to increase the height of capacitors, reduces the process difficulty and improves the storage capacity of a memory. FIG. 3 is a flow chat of a manufacturing method for a semiconductor structure provided by embodiments of the disclosure. Referring to FIG. 3, the manufacturing method for a semiconductor structure provided by embodiments of the disclosure includes the following operations.

In S100: a semiconductor layer is provided.

In S200: a plurality of transistors is formed in the semiconductor layer; each of the transistors includes a semiconductor body extending in a first direction and a gate structure covering at least one side surface of the semiconductor body, and the first direction is a thickness direction of the semiconductor layer.

In S300: a conductive pillar is formed on an exposed top surface of each semiconductor body.

In S400: a memory structure covering the conductive pillar is formed.

It should be understood that the operations shown in FIG. 3 are not exclusive and that other operations may be performed before, after, or between any of the shown operations. The operations shown in FIG. 3 can be sequenced according to actual needs. FIGS. 4A to 4D are schematic cross-sectional diagrams of a manufacturing process for a semiconductor structure provided by embodiments of the disclosure. The manufacturing method for a semiconductor structure provided by embodiments of the disclosure will be described in detail below in combination with FIG. 3 and FIGS. 4A to 4D.

Figure 4A:
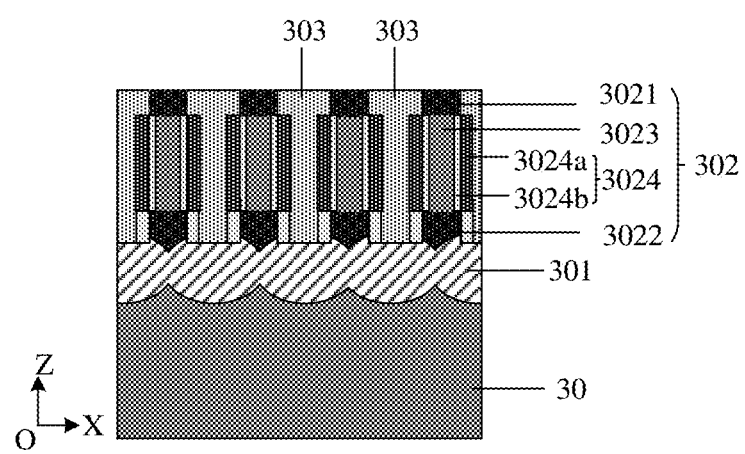
FIG. 4A is a schematic cross-sectional diagram showing a manufacturing process for a semiconductor structure provided by embodiments of the disclosure.

In S100, referring to FIG. 4a, the semiconductor layer 30 is provided.

The material of the semiconductor layer may include silicon (Si), germanium (Ge), silicon germanium (SiGe), and the like. In some specific embodiments, the semiconductor layer may also be silicon-on-insulator (SOI) or germanium-on-insulator (GOI).

In some embodiments, the method further includes: providing a substrate; and forming a semiconductor layer on the substrate.

Herein, the substrate may include various semiconductor materials, such as silicon, silicon germanium, germanium, gallium arsenide, indium phosphide, or the like. In some specific examples, the material of the substrate includes silicon, and the semiconductor layer includes silicon germanium.

In some embodiments, the semiconductor layer may be formed by physical vapor deposition (PVD), chemical vapor deposition (CVD), atomic layer deposition (ALD), or the like.

In some embodiments, referring to FIG. 4A, the method further includes: before forming the plurality of transistors, forming a plurality of bit lines 301 in the semiconductor layer.

Here, the bit lines 301 are configured to perform a read or write operation on the transistor 302 when the transistor 302 is turned on.

The material of the bit lines 301 includes, but is not limited to, tungsten.

The bit lines 301 may be formed by a process such as PVD, CVD or ALD.

In S200, a plurality of transistors 302 are formed in the semiconductor layer 30.

Here, the transistors 302 are in direct contact with the bit lines 301.

In some embodiments, the types of the transistors include one of
 a column gate transistor;
 a semi-around gate transistor;
 an all-around gate transistor.

Herein, in a column gate transistor, the gate is formed on one side of the channel region in a column form; in a semi-around gate transistor, the gate half surrounds the channel region; in an all-around gate transistor, the gate completely surrounds the channel region.

The types of transistors in embodiments of the disclosure may include but are not limited to the various types described above. For clarity and conciseness of description the following embodiments will be described with an example of an all-around gate transistor. It should be noted however that the description of the following embodiments with respect to the types of transistors is intended only to illustrate the disclosure and is not intended to limit the protection scope of the disclosure.

In some embodiments, forming the plurality of transistors 302 in the semiconductor layer 30 includes the following operation.

The semiconductor layer 30 is etched from the surface of the semiconductor layer 30 in a first direction to form a semiconductor body (not shown in FIG. 4A) of the transistor.

Herein, a source (S) 3021 and a drain (D) 3022 of the transistor are formed respectively at opposite ends of the semiconductor body along the first direction. A region between the source and the drain in the semiconductor body is the channel region 3023.

The first direction is a direction in which the semiconductor body extends, and the first direction is also a direction perpendicular to the semiconductor layer 30. In some specific examples, the first direction may be the Z-axis direction shown in FIG. 4A.

In some embodiments, the source and the drain are opposite ends of the channel region in the Z-axis direction, respectively, and the positions of the source and the drain can be interchanged. In embodiments of the disclosure, it is taken as an example that the drain is located at the bottom of the semiconductor body and connected with the bit lines; in other words, in the embodiments of the disclosure, the bit lines 301 are in direct contact with the bottom surface (i.e. drain electrode 3022) of the semiconductor body in the plurality of transistors 302. The top surface of the semiconductor body (i.e. the source 3021) is exposed.

In some embodiments, the source 3021 and the drain 3022 may be formed by doping or diffusion or other suitable methods.

For example, doping is achieved by ion implantation to form the source 3021 and the drain 3022.

For example, the drain 3022 near the bit line 301 may be formed first and then the source 3021 away from the bit line 301 may be formed.

In embodiments of the disclosure, the method further includes: forming a gate structure 3024 of an all-around transistor on a side of the semiconductor body.

It should be noted that, the gate structure 3024 here includes a gate (G) 3024a and a gate oxide layer 3024b, in which the gate oxide layer 3024b is located between the gate 3024a and the channel region 3023 and is configured to electrically isolate the channel region 3023 and the gate 3024a to reduce the hot carrier effect of the transistor.

Here, the material of the gate 3024a may include metal or polysilicon (Poly) or the like. The material of the gate oxide layer 3024b may include, but is not limited to, silicon oxide.

In some embodiments, the process for forming the gate 3024a includes, but is not limited to, PVD, CVD, ALD and the like. The method for forming the gate oxide layer 3024b includes, but is not limited to, in-situ oxidation.

It should be noted that, different types of transistors have different positions of the gate 3024a. In other words, the gate 3024a may be located on one side of the channel region 3023, or may also be located on opposite sides of the channel region 3023, and may also be located around the channel region 3023. The specific position can be determined according to the type of the transistor. In an all-around gate transistor, the gate 3024a is located around the channel region 3023.

In embodiments of the disclosure, the method further includes: forming an insulating layer 303 at a gap between the plurality of transistors 302 in the semiconductor layer.

The insulating layer 303 may be configured to electrically isolate a plurality of transistors 302, and also to play the role of supporting.

Here, the material of the insulating layer 303 includes, but is not limited to, silicon nitride (SiN).

The method for forming the insulating layer includes, but is not limited to, PVD, CVD, ALD or the like.

Figure 4B:
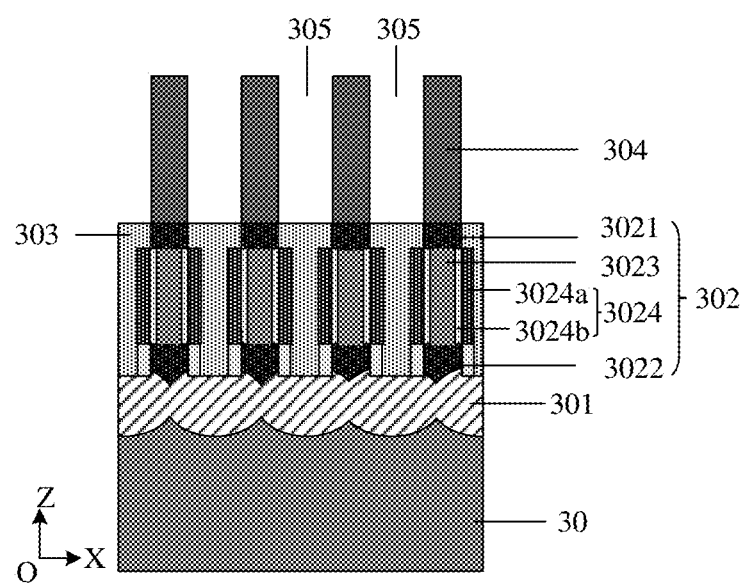
FIG. 4B is a schematic cross-sectional diagram showing a manufacturing process for a semiconductor structure provided by embodiments of the disclosure.

In S300, referring to FIG. 4B, a conductive pillar 304 is formed on an exposed top surface of each semiconductor body.

In some embodiments, the material of the conductive pillar 304 may be other conductive materials that may be unidirectional grown along the first direction.

For example, the material of the conductive pillar 304 includes silicon germanium.

In some embodiments, the conductive pillar 304 may be formed by epitaxial growth.

Here, epitaxial growth refers to the growth of a material layer with certain requirements and the same crystal orientation as the semiconductor body on the exposed top surface of the semiconductor body.

It could be understood that, in the embodiments of the disclosure, during the process for forming a plurality of conductive pillars through epitaxial growth, self-alignment between the conductive pillars and the sources can be realized; that is, the difficulty of aligning the conductive pillar 304 with the top surface of the semiconductor body (i.e. the sources) is reduced or avoided.

In embodiments of the disclosure, referring to FIG. 4B, a gap 305 is presented between a plurality of conductive pillars arranged in a second direction.

Here, the second direction is perpendicular to the first direction and is perpendicular to the surface of the semiconductor layer. For example, the second direction may be the X-axis direction shown in FIG. 4B.

It should be noted that, in some embodiments, the plurality of transistors 302 formed in the semiconductor layer 30 may be arrayed in the second direction and a third direction, respectively (here, the third direction is perpendicular to both the first direction and the second direction), in which case, correspondingly, the plurality of conductive pillars 304 are arrayed in the second direction and the third direction.

Figure 4C:
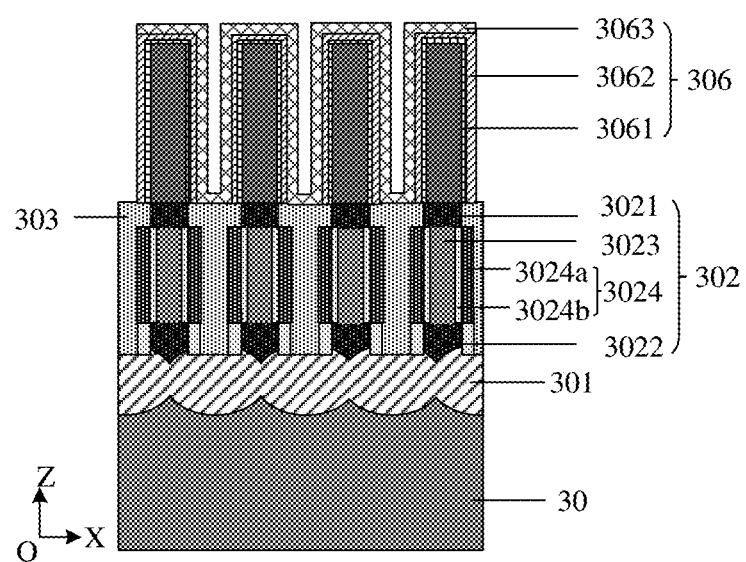
FIG. 4C is a schematic cross-sectional diagram showing a manufacturing process for a semiconductor structure provided by embodiments of the disclosure.

In S400, referring to FIG. 4C, a memory structure 306 covering the conductive pillars is formed in the gap 305.

Here, the memory structure 306 is configured to store data. For example, the memory structure 306 includes a capacitor.

In some embodiments, the operation that the memory structure 306 is formed includes the following operations.

A lower electrode conductive layer 3061 covering the conductive pillar is formed through selective deposition.

A dielectric layer 3062 covering the surface of the lower electrode conductive layer is formed by selective deposition.

An upper electrode conductive layer 3063 covering the dielectric layers 3062 and the top surface of the insulating layer 303 is formed.

Here, the lower electrode conductive layer 3061 serves as a lower electrode of the capacitor; the dielectric layer 3062 serves as a dielectric of the capacitor; and the upper electrode conductive layer 3063 serves as an upper electrode of the capacitor.

Here, selective deposition refers to selectively depositing the lower electrode conductive layer on the surface of the conductive pillar, and selectively depositing the dielectric layer on the surface of the lower electrode conductive layer.

In some embodiments, the material of the conductive pillar 304 may be the same as or different from the material of the lower electrode conductive layer 3061 or the upper electrode conductive layer 3063. In some specific embodiments, the material of both the lower electrode conductive layer 3061 and the upper electrode conductive layer 3063 may include, but are not limited to, titanium nitride (TiN).

The material of the dielectric layer 3062 includes a High-K material, which generally refers to a material with a dielectric constant higher than 3.9, and typically significantly higher than this value. In some specific examples, the material of the dielectric layer 3062 may include, but is not limited to, hafnium oxide ($HfO_2$).

It should be noted that, in the embodiments of the disclosure, during the process for forming the lower electrode conductive layer 3061 by selective deposition, the material configured to form the lower electrode conductive layer 3061 can be made to grow only on the surface of the conductive pillar 304 or to be formed on another selected material without being formed on the top surface of the insulating layer 303, as shown in FIG. 4C. Similarly, during the process for forming the dielectric layer 3062 by selective deposition, the material configured to form the dielectric layer 3062 can be made to be formed only on the surface of the lower electrode conductive layer 3061 without being formed on the top surface of the insulating layer 303, as show in FIG. 4C. In this way, on the one hand, the formation of the lower electrode conductive layer 3061 and the dielectric layer 3062 in the gap with a higher aspect ratio is avoided, thus reducing the process difficulty and improving the process window. On the other hand, the occurrence of hole problem can also be avoid in the process for forming the lower electrode conductive layer, the dielectric layer and the upper electrode conductive layer by other processes, thereby improving the reliability of the semiconductor structure.

In addition, in the embodiments of the present disclosure, the formation of the conductive pillar 304 by epitaxial growth and the formation of the memory structure 306 by selective deposition can further avoid the problem of multiple overlapping lithography occurring in the process of forming etching holes (configured to form the memory structure) in the semiconductor layer by mask technology.

It should be noted that part of the upper electrode conductive layer 3063 covering the dielectric layers 3062 and part of the upper electrode conductive layer 3063 located on the top surface of the insulating layer 303 are connected as a whole, so that the surface area of the upper electrode conductive layer 3063 can be increased and thus the storage capacity of the memory structure can be improved.

In some embodiments, the method for forming the upper electrode conductive layer 3063 includes, but is not limited to, PVD, CVD, ALD or the like. It could be understood that the upper electrode conductive layer 3063 does not need a selective deposition process.

Figure 4D:
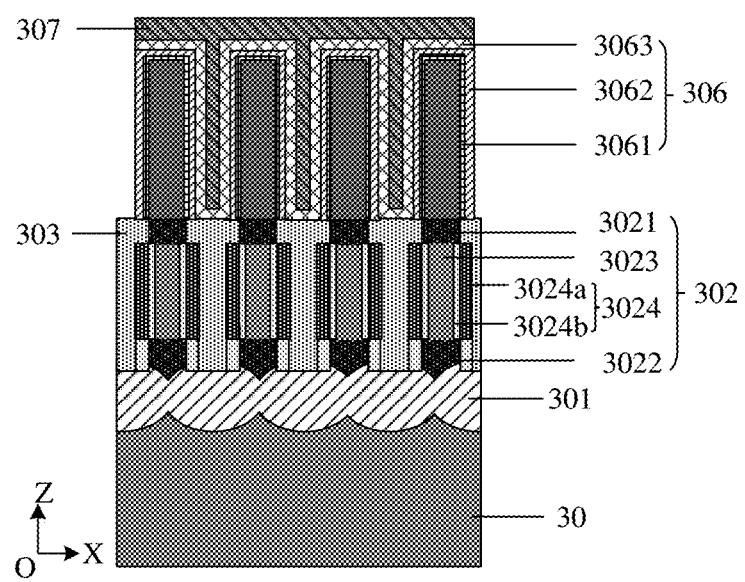
FIG. 4D is a schematic cross-sectional diagram showing a manufacturing process for a semiconductor structure provided by embodiments of the disclosure.

In some embodiments, referring to FIG. 4D, the upper electrode conductive layer 3063 may directly fill the gap between two adjacent ones of the dielectric layers 3062.

In some embodiments, after the upper electrode conductive layer 3063 is formed, a conductive material layer 307 is filled in the gap of the upper electrode conductive layer 3063. In some specific examples, the material of the conductive material layer 307 may include, but is not limited to, silicon germanium.

It could be understood that it may be difficult to form the upper electrode conductive layer 3063 by directly filling the gap between two adjacent dielectric layers 3062 by deposition, and it is prone to form a hole, etc. By forming the conductive material layer 307 in the gap above the upper electrode conductive layer 3063, it is possible to reduce the process difficulty and form the upper electrode conductive layer 3063 with better quality. Here, the conductive material layer 307 is also configured to enhance the stability of the semiconductor structure.

In the above embodiments of the disclosure, the conductive pillar may be formed only at the position directly in contact with the semiconductor body by epitaxial growth, thereby reducing the alignment difficulty between the transistor and the conductive pillar, increasing the process window and improving the reliability of the semiconductor structure. At the same time, through selective deposition, a memory structure can be formed in a gap with large aspect ratio, which increases the process window, reduces the process difficulty and thus improves the reliability of the semiconductor structure.

It could be understood that the size and storage capacity of the memory structure depends on the height of the conductive pillar. On the basis of this, in some embodiments of the disclosure, in order to improve the storage capacity of the memory structure and increase the height of the conductive pillar, another semiconductor structure and a manufacturing method thereof are proposed.

In some other embodiments, each of conductive pillars includes N sub-conductive pillars stacked along the first direction, where N is a positive integer greater than or equal to 1; accordingly, the memory structure includes N sub-memory structures stacked along the first direction.

The operation of forming the conductive pillar and the memory structure includes the following operations.

A sub-conductive pillar and a corresponding sub-memory structure are formed on the semiconductor body.

(N-1) sub-conductive pillars and (N-1) corresponding sub-memory structures are formed sequentially along the first direction.

Here, by forming a plurality of sub-conductive pillars and stacking the plurality of sub-conductive pillars to form a conductive pillar, the total height of the conductive pillar is increased, thereby increasing the surface of the memory structure and increasing the storage capacity of the memory.

In other words, a plurality of sub-conductive pillars which are stacked and a plurality of sub-memory structures covering the surfaces of corresponding sub-conductive pillars are formed on the semiconductor layer (i.e., one of two opposite ends of the source away from the channel region) by epitaxial growth.

Herein, the sub-conductive pillar corresponds to the sub-memory structure one by one.

It should be noted that, in the embodiments of the disclosure, N sub-conductive pillars which are stacked can be formed on the semiconductor layer. In order to reduce the process difficulty of forming the sub-memory structures, a corresponding sub-memory structure is formed after each sub-conductive pillar is formed.

Correspondingly, N sub-conductive pillars stacked along the Z-axis direction correspond to N sub-memory structures stacked along the Z-axis direction.

It should be noted that the sub-memory structure at the top (i.e., the Nth sub-memory structure) is different from the sub-memory structures not at the top (the 1st to (N-1)th sub-memory structures). Specifically, the sub-memory structure not at the top cover only the sidewalls of the corresponding sub-conductive pillar, while the sub-memory structure at the top covers the top and the sidewall of the corresponding sub-conductive pillar.

In some embodiments, after the 1st to Nth sub-conductive pillars and their corresponding sub-memory structures are formed, part of the sub-memory structure is formed at the top of the Nth sub-conductive pillar, so that the part of the sub-memory structure located at the top of the Nth sub-conductive pillar is connected with the part of the memory structure at the sidewall of the Nth sub-conductive pillar to form a complete Nth sub-memory structure.

In some other embodiments, the 1st to (N-1)th sub-conductive pillars and the corresponding 1st to (N-1)th sub-memory structures are formed firstly; next, the Nth sub-conductive pillar is formed; and then, a sub-memory structure covering the top and sidewall of the Nth sub-conductive pillar is formed at the same time.

It could be understood that the operation of forming the sub-memory structure covering the sidewall and the top of the Nth sub-conductive pillar at the same time can save the process flow and reduce the manufacturing cost.

For example, the operation of forming the conductive pillar and the memory structure includes sequentially forming (N-1) sub-conductive pillars and corresponding (N-1) sub-memory structures stacked along the Z-axis direction, in which after each sub-conductive pillar is formed, a corresponding sub-memory structure is formed.

Next, the Nth sub-conductive pillar is formed on the (N-1)th sub-conductive pillar, and the Nth sub-memory structure covering the top and sidewall of the Nth sub-conductive pillar is formed.

Here, in the process of forming the Nth sub-memory structure, the timing of forming the sub-memory structure located on the top of the Nth sub-conductive pillar can be selected according to the factual requirements.

In order to more clearly understand the intention of the disclosure, a detailed description will be given below with the example that each of the conductive pillars includes three sub-conductive pillars and each of the memory structures includes three sub-memory structures.

That is, the N=3, and the conductive pillar includes a first sub-conductive pillar, a second sub-conductive pillar located on the first sub-conductive pillar, and a third sub-conductive pillar located on the second sub-conductive pillar.

Correspondingly, the memory structure includes a first sub-memory structure covering the first sub-conductive pillars, a second sub-memory structure covering the second sub-conductive pillars, and a third sub-memory structure covering the third sub-conductive pillars.

In some embodiments, the operation of forming the conductive pillars and the memory structures includes the following operations.

A first sub-conductive pillar is formed on an exposed top surface of each semiconductor body.

A first sub-memory structure covering the first sub-conductive pillars is formed.

A second sub-conductive pillar is formed on an exposed top surface of each first sub-conductive pillar, in which the first sub-conductive pillar is in direct contact with a corresponding second sub-conductive pillar.

A second sub-memory structure covering the second sub-conductive pillars is formed, in which the first sub-memory structure is in direct contact with the second sub-memory structure.

A third sub-conductive pillar is formed on an exposed top surface of each second sub-conductive pillar, and the third sub-conductive pillar is in direct contact with a corresponding second sub-conductive pillar.

A third sub-memory structure covering the third sub-conductive pillars is formed, and the third sub-memory structure is in direct contact with the second sub-memory structure.

Figure 5A:
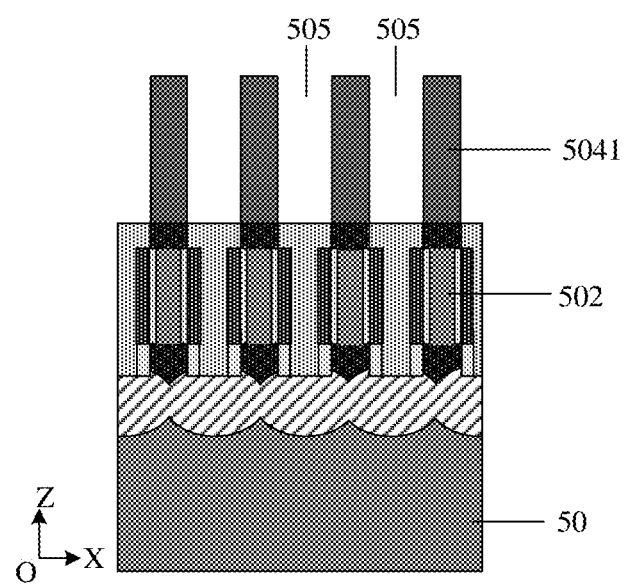
FIG. 5A is a schematic cross-sectional diagram showing another manufacturing process for a semiconductor structure provided by embodiments of the disclosure.

Here, referring to FIG. 5A, a semiconductor layer 50 is provided, which is the same as the semiconductor layer 30 in the foregoing embodiments.

The semiconductor layer 50 includes a plurality of transistors 502, and one end of the transistor 502 (i.e. the exposed end of the semiconductor body) is substantially flush with the top surface of the semiconductor layer 50. As mentioned above, it will not be repeated here.

In embodiments of the disclosure, a first sub-conductive pillar 5041 is formed on an exposed top surface of each semiconductor body by epitaxial growth.

Here, a gap 505 is presented between the plurality of first sub-conductive pillars.

Figure 5B:
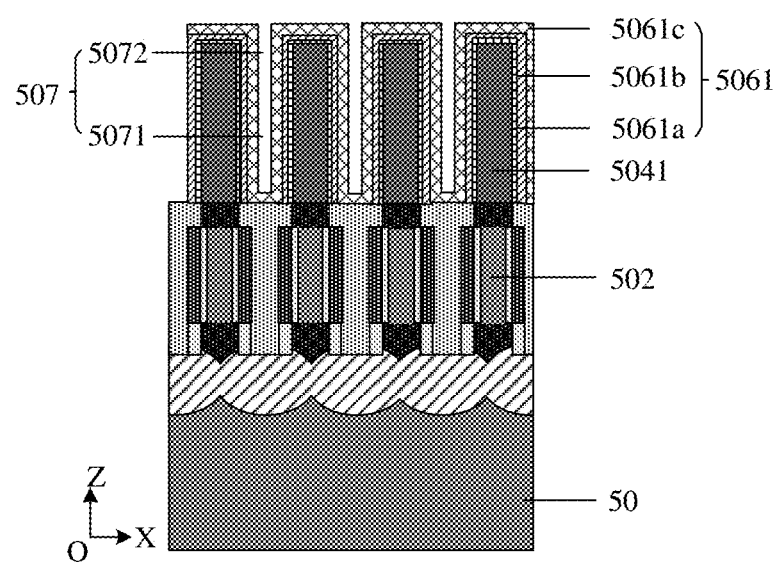
FIG. 5B is a schematic cross-sectional diagram showing another manufacturing process for a semiconductor structure provided by embodiments of the disclosure.

Next, referring to FIG. 5B, a first sub-memory structure 5061 covering the first sub-conductive pillars is formed in the gap 505. The first sub-memory structure 5061 includes lower electrode conductive layers 5061a, dielectric layers 5061b and an upper electrode conductive layer 5061c.

Specifically, in some embodiments, the operation of forming the first sub-memory structure covering the first sub-conductive pillars includes the following operations.

A lower electrode conductive layer 5061a covering a top and a sidewall of each first sub-conductive pillar 5041 is formed through selective deposition.

A dielectric layer 5061b covering each lower electrode conductive layer 5061a is formed by selective deposition, and a first gap (not shown in FIG. 5B) is formed between two adjacent ones of the dielectric layers 5061.

An upper electrode conductive layer 5061c covering a plurality of dielectric layers 5061b and a bottom of the plurality of first gap is formed.

Here, the lower electrode conductive layers 5061a are only formed on the tops and the sidewalls of the first sub-conductive pillars 5041 through selective deposition, without forming the lower electrode conductive layers 5061a on the bottoms of the gaps.

Similarly, the dielectric layers 5061b are only formed on the sidewalls of the lower electrode conductive layers 5061a by selective deposition.

In this way, the lower electrode conductive layer 5061a and the dielectric layer 5061b can be formed in the gap 505 with a deep aspect ratio, the process window is increased, and the process difficulty is reduced, thereby improving the reliability of the device.

It could be understood that the upper electrode conductive layer 5061c does not need a selective deposition process. For example, the process for forming the upper electrode conductive layer 5061c includes, but is not limited to, PVD, CVD, ALD or the like.

Here, the part of the upper electrode conductive layer 5061c covering the dielectric layer 5061b and the part of the upper electrode conductive layer 5061c located on the top surface of the insulating layer are connected as a whole, so that the storage capacity of the memory structure can be improved.

Next, the method further includes the following operation.

A first support layer 507 is formed in the plurality of first gaps where the upper electrode conductive layer is formed.

Here, the first support layer 507 includes a first conductive material layer 5071 and a first dielectric material layer 5072 located on the first conductive material layer 5071.

Figure 5C:
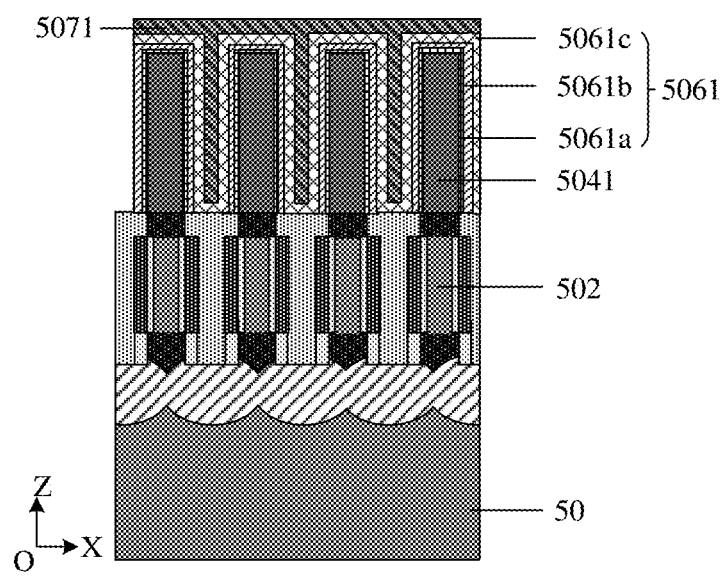
FIG. 5C is a schematic cross-sectional diagram showing another manufacturing process for a semiconductor structure provided by embodiments of the disclosure.

Referring to FIG. 5C, a first conductive material layer 5071 is formed in the plurality of first gaps between the first sub-memory structure 5061 and a top surface of the upper electrode conductive layer 5061c by PVD, CVD or the like.

In some embodiments, the material of the first conductive material layer 5071 may be the same as or different from the material of the conductive pillar 504. In practice, it can be selected and set according to the actual needs. For example, the material of the first conductive material layer 5071 includes, but is not limited to, silicon germanium.

Figure 5D:
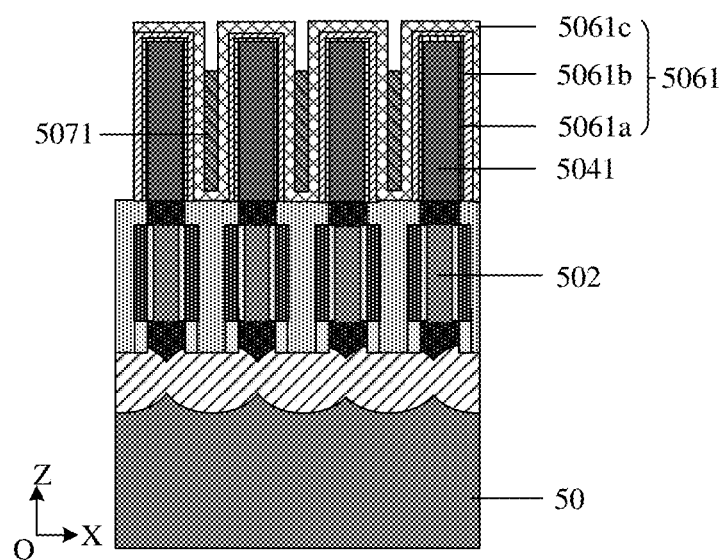
FIG. 5D is a schematic cross-sectional diagram showing another manufacturing process for a semiconductor structure provided by embodiments of the disclosure.

Referring to FIG. 5D, the first conductive material layer 5071 is etched to remove the part of the first conductive material layer 5071 located on the top surface of the upper electrode conductive layer 5061c and partly remove the part of first conductive material layer 5071 in the first gaps.

Here, the top surface of the first conductive material layer 5071 remaining in the first gap is lower than the top surface of the upper electrode conductive layer 5061c.

Figure 5E:
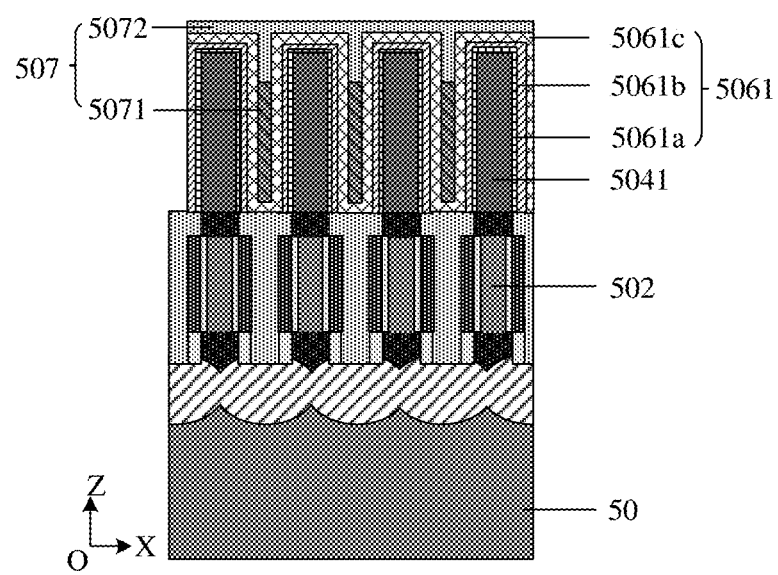
FIG. 5E is a schematic cross-sectional diagram showing another manufacturing process for a semiconductor structure provided by embodiments of the disclosure.

Referring to FIG. 5E, a first dielectric material layer 5072 is formed on the top surface of the upper electrode conductive layer 5061c and the top surface of the first conductive material layer 5071.

In some specific examples, the material of the first dielectric material layer 5072 includes, but is not limited to, silicon nitride (SiN).

The process for forming the first dielectric material layer 5072 includes, but is not limited to, PVD, CVD, ALD or the like.

It should be noted that the first dielectric material layer used here is silicon nitride, so that in the subsequent process, when the second sub-conductive pillar 5042 is formed by epitaxial growth, the second sub-conductive pillar 5042 is not formed on the first dielectric material layer (silicon nitride), and when the lower electrode conductive layers and the dielectric layers of the second sub-memory structure are formed by selective deposition, the lower electrode conductive layers and the dielectric layers of the second sub-memory structure are not formed on the first dielectric material layer (silicon nitride).

Figure 5F:
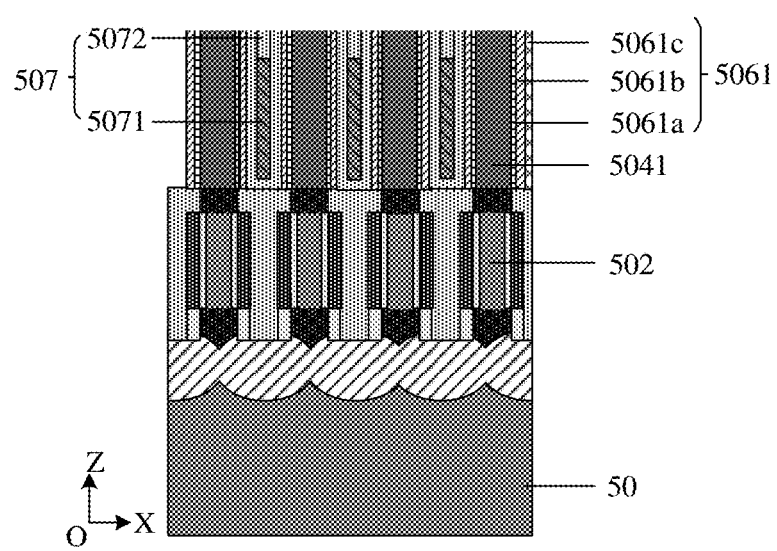
FIG. 5F is a schematic cross-sectional diagram showing another manufacturing process for a semiconductor structure provided by embodiments of the disclosure.

Referring to FIG. 5F, the method further includes the following operation.

The lower electrode conductive layer 5061a, the dielectric layer 5061b and the upper electrode conductive layer 5061c on the top surface of the first sub-conductive pillar 5041 are etched to expose the top surface of the each first sub-conductive pillar 5041. At this time, the top surface of the first dielectric material layer 5072 remaining in the first gap is substantially flush with the exposed top surface of the first sub-conductive pillar 5041.

In some embodiments, the removal process includes, but is not limited to, chemical mechanical polish (CMP).

Figure 5G:
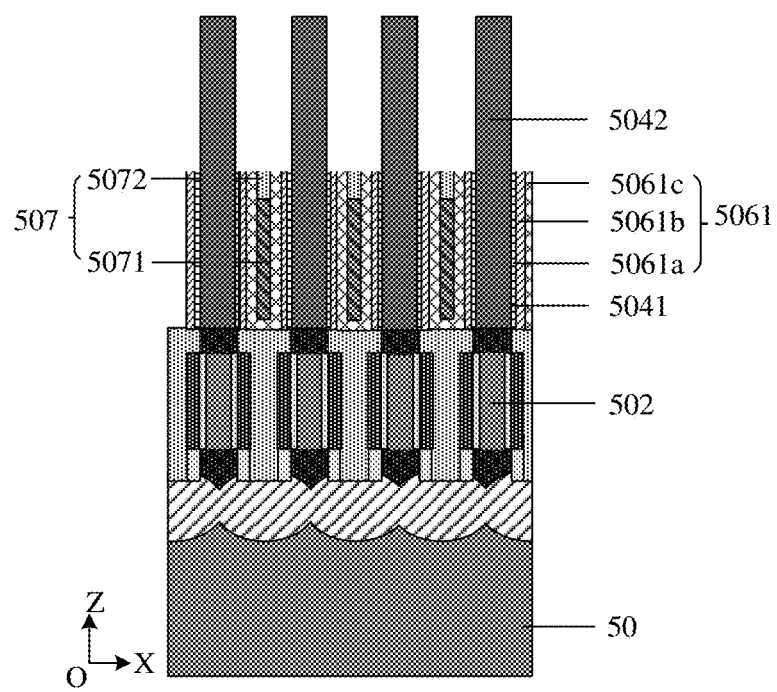
FIG. 5G is a schematic cross-sectional diagram showing another manufacturing process for a semiconductor structure provided by embodiments of the disclosure.

Next, referring to FIG. 5G, the second sub-conductive pillar 5042 is formed on the exposed top surface of each first sub-conductive layer 5041.

Here, the second sub-conductive pillar 5042 and the first sub-conductive pillar 5041 are made of the same material and formed by the same method, which have been described above and will not be repeated here.

Figure 5H:
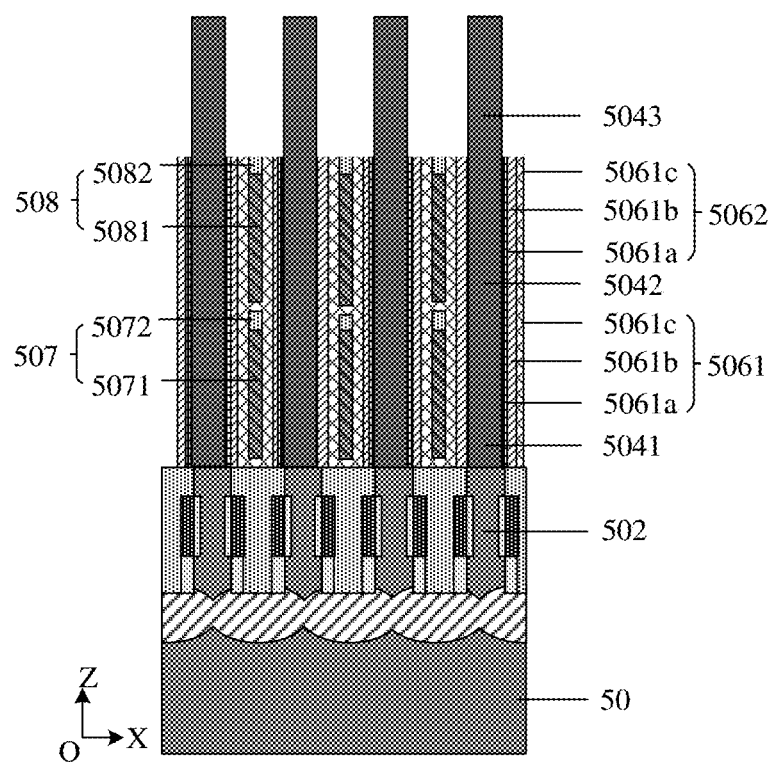
FIG. 5H is a schematic cross-sectional diagram showing another manufacturing process for a semiconductor structure provided by embodiments of the disclosure.

Next, referring to FIG. 5H, the second sub-memory structure 5062 covering the second sub-conductive pillars 5042 is formed. Herein, the second sub-memory structure 5062 includes lower electrode conductive layers 5061a, dielectric layers 5061b and an upper electrode conductive layer 5061c.

Here, the material of both the lower electrode conductive layer 5061a and the upper electrode conductive layer 5061c may include, but are not limited to, titanium nitride.

Specifically, in some embodiments, the operation of forming the second sub-memory structure covering the second sub-conductive pillars includes the following operations.

A lower electrode conductive layer 5061a covering the top and the sidewall of each second sub-conductive pillar 5042 is formed through selective deposition, in which the lower electrode conductive layers 5061a of the second sub-memory structure 5062 are in direct contact with the lower electrode conductive layers 5061a of the first sub-memory structure 5061.

A dielectric layer 5061b covering the upper electrode conductive layer of each of the second sub-conductive pillars 5042 is formed by selective deposition, in which the dielectric layers 5061b of the second sub-memory structure 5062 is in direct contact with the dielectric layers 5061b of the first sub-memory structure 5061, and a second gap is formed between two adjacent ones of dielectric layers.

An upper electrode conductive layer 5061c covering the plurality of dielectric layers and the bottoms of a plurality of second gaps is formed and the upper electrode conductive layer 5061c of the second sub-memory structure 5062 is in direct contact with the upper electrode conductive layer 5061c of the first sub-memory structure 5061. Here, it should be noted that the lower electrode conductive layer 5061a is only formed on the top and the sidewall of the second sub-conductive pillar 5042 through selective deposition, and the dielectric layer 5061b is only formed on the sidewall of the lower electrode conductive layer 5061a. In this way, a sub-memory structure can be formed in a gap with a higher aspect ratio, which increases the process window, reduce the process difficulty and improve the reliability of the semiconductor structure.

Next, after the second sub-memory structure 5062 is formed, in order to increase the stability of the semiconductor structure and thus improve the reliability of the memory device, a second support layer 508 is formed in a plurality of second gaps where the upper electrode conductive layer is formed.

Here, the second support layer 508 includes a second conductive material layer 5081 and a second dielectric material layer 5082 located on the second conductive material layer 5081.

In practice, the second conductive material layer 5081 can be formed first, and then the second dielectric material layer 5082 is formed on the second conductive material layer 5081.

It should be noted that the second support layer 508 is the same as the first support layer 507, in which the second conductive material layer 5081 is the same as the first conductive material layer 5071, the second dielectric material layer 5082 is the same as the first dielectric material layer 5072, and the material and the forming method have been described above, and will not be repeated here.

In some embodiments, the method further includes the following operation.

The lower electrode conductive layer 5061a, the dielectric layer 5061b and the upper electrode conductive layer 5061c on the top surface of the second sub-conductive pillar 5042 are removed to expose the top surface of the second sub-conductive pillar 5042; in which the top surface of the second dielectric material layer 5082 is substantially flush with the exposed top surface of the upper electrode conductive layer 5061c.

Next, referring to FIG. 5H, a third sub-conductive pillar 5043 is formed on an exposed top surface of each second sub-conductive pillar 5042.

Here, the third sub-conductive pillar 5043 is made of the same material as those of the first sub-conductive pillar 5041 and the second sub-conductive pillar 5042 and formed by the same method, which have been described above and will not be repeated here.

Figure 5I:
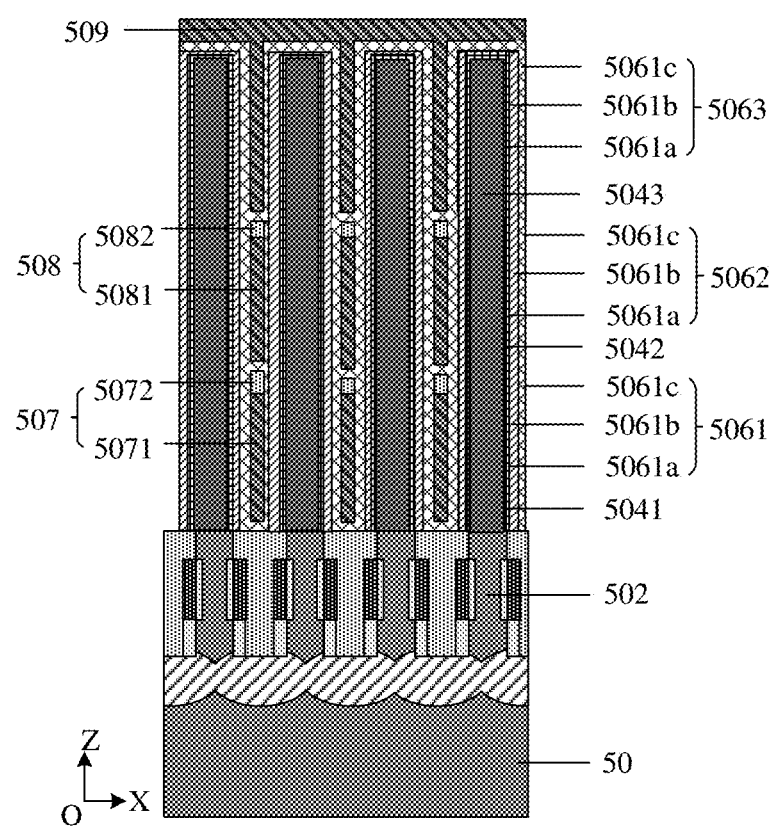
FIG. 5I is a schematic cross-sectional diagram showing another manufacturing process for a semiconductor structure provided by embodiments of the disclosure.

Next, referring to FIG. 5I, the third sub-memory structure 5063 covering the third sub-conductive pillars 5043 is formed. Herein, the third sub-memory structure 5063 includes lower electrode conductive layers 5061a, dielectric layers 5061b and an upper electrode conductive layer 5061c.

In some embodiments, the operation of forming the third sub-memory structure 5063 covering the third sub-conductive pillars 5043 includes the following operations.

A lower electrode conductive layer 5061a covering the top and the sidewall of each third sub-conductive pillar 5043 is formed through selective deposition, in which the lower electrode conductive layer 5061a of the third sub-memory structure 5063 is in direct contact with the lower electrode conductive layer 5061a of the second sub-memory structure 5062.

A dielectric layer covering the lower electrode conductive layer of each third sub-conductive pillar 5043 is formed by selective deposition, in which the dielectric layer 5061b of the third sub-memory structure 5063 is in direct contact with the dielectric layer 5061b of the second sub-memory structure 5062, in which a third gap (not shown in FIG. 5F) is formed between two adjacent ones of dielectric layers 5061b of the third sub-memory structure 5063 along the X-axis direction.

An upper electrode conductive layer 5061c covering the plurality of dielectric layers 5061b of the third sub-memory structure 5063 and the bottoms of a plurality of third gaps is formed, in which the lower electrode conductive layers 5061a of the third sub-memory structure 5063 located at the sidewall of the third sub-conductive pillar is in direct contact with the lower electrode conductive layers 5061a of the second sub-memory structure 5062.

In some embodiments of the disclosure, the method further includes the following operation.

A third conductive material layer 509 is formed in the plurality of third gaps where the upper electrode conductive layer is formed and on the top of the upper electrode conductive layer.

Here, the filling of the third conductive material layer 509 in the third gaps can reduce the process difficulty compared to the filling of the third gaps with other materials. In addition, the third conductive material layer 509 may also be configured to secure a plurality of third sub-memory structures to enhance the reliability of the semiconductor structure.

In the embodiments of the disclosure, the upper and the lower electrode conductive layers in the first sub-memory structure, the second sub-memory structure and the third sub-memory structure are connected with each other to form a complete upper and lower electrode layer.

The dielectric layers in the first sub-memory structure, the second sub-memory structure and the third sub-memory structure are connected with each other to form a complete dielectric layer.

Figure 6:
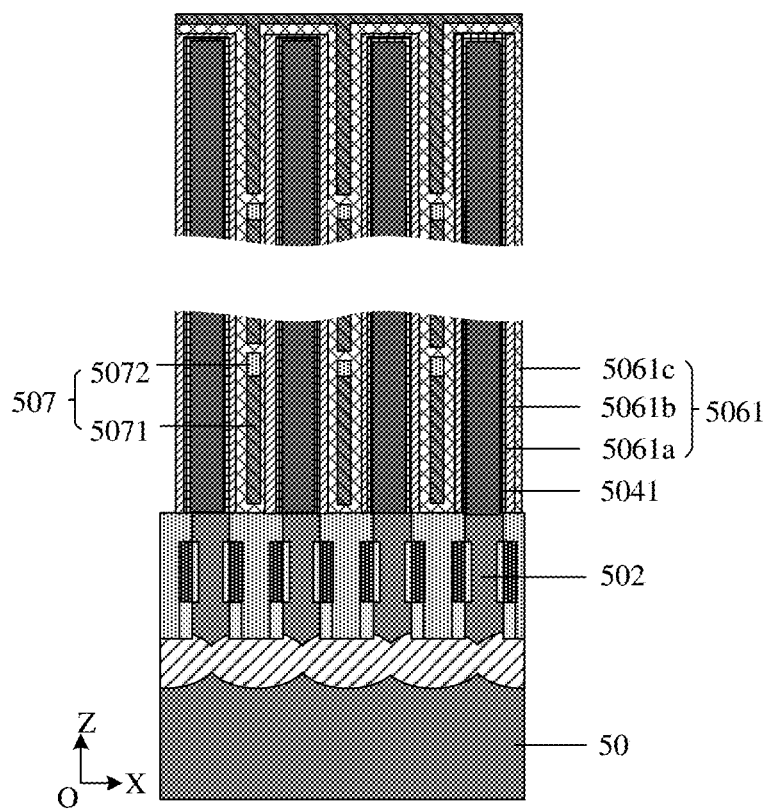
FIG. 6 is a schematic cross-sectional diagram of a semiconductor structure provided by embodiments of the disclosure.

In some embodiments, referring to FIG. 6, in order to increase the height of the memory structure and increase the storage capacity of the semiconductor structure, a fourth sub-conductive pillar, a fifth sub-conductive pillar, or the like may also be formed on the third sub-conductive pillar in the semiconductor structure. Accordingly, a fourth sub-memory structure covering the fourth sub-conductive pillar and a fifth sub-memory structure covering the fifth sub-conductive pillar and the like are formed.

In the embodiments of the disclosure, the conductive pillar may be formed only at the position directly in contact with the semiconductor body by epitaxial growth, thereby reducing the alignment difficulty between the transistor and the conductive pillar, increasing the process window and improving the reliability of the semiconductor structure. At the same time, through selective deposition, a memory structure can be formed in a gap with large aspect ratio, which increases the process window, and reduces the process difficulty. Furthermore, in some other embodiments, sequentially forming a plurality of sub-conductive pillars that are directly contacted and corresponding sub-memory structures allows the size of the memory structure in the semiconductor structure to be increased with the increase of the size of the conductive pillars, so that the size of the memory structure can be set according to actual requirements, thereby improving the storage capacity of the memory structure.

Embodiments of the present disclosure further provide a semiconductor structure. The semiconductor structure includes:
  a plurality of transistors located in a semiconductor layer; in which each of the transistors includes a semiconductor body extending in a first direction and a gate structure covering at least one side surface of the semiconductor body, and the first direction is a thickness direction of the semiconductor layer;
  a plurality of conductive pillars, in which each of the conductive pillars is located on a top surface of a corresponding semiconductor body and is in direct contact with the corresponding semiconductor body;
  a memory structure covering the plurality of conductive pillars.

In some embodiments, each of the conductive pillars includes N sub-conductive pillars stacked along the first direction, where N is a positive integer greater than or equal to 1; accordingly, the memory structure includes N sub-memory structures stacked along the first direction.

In some embodiments, the N=3, the semiconductor structure further includes:
  a first sub-conductive pillar located on the top surface of each semiconductor body; a first sub-memory structure covering sidewalls of the first sub-conductive pillars;
  a second sub-conductive pillar located on a top surface of each first sub-conductive pillar; a second sub-memory structure covering sidewalls of the second sub-conductive pillars; and
  a third sub-conductive pillar located on a top surface of each second sub-conductive pillar; a third sub-memory structure covering top surfaces and sidewalls of the third sub-conductive pillars;
  in which, the first sub-conductive pillar, the second sub-conductive pillar and the third sub-conductive pillar are in direct contact, and the first sub-memory structure, the second sub-memory structure and the third sub-memory structure are in direct contact.

In some embodiments, the first sub-memory structure includes: a plurality of lower electrode conductive layers covering the sidewalls of corresponding first sub-conductive pillars, a plurality of dielectric layers covering corresponding lower electrode conductive layers, an upper electrode conductive layer covering a plurality of dielectric layers and a top surface of a semiconductor layer between two adjacent ones of the dielectric layers, a conductive material layer and a dielectric material layer stacked in sequence in the upper electrode conductive layer.

The second sub-memory structure includes: a plurality of lower electrode conductive layers covering sidewalls of corresponding second sub-conductive pillars, a plurality of dielectric layers covering corresponding lower electrode conductive layers, an upper electrode conductive layer covering the plurality of dielectric layers and a top surface of the dielectric material layer, a conductive material layer and a dielectric material layer stacked in sequence in the upper electrode conductive layer.

The third sub-memory structure includes: a lower electrode conductive layer covering a sidewall and a top surface of each third sub-conductive pillar, a dielectric layer covering each lower electrode conductive layer, an upper electrode conductive layer covering a plurality of dielectric layers and a top surface of the dielectric material layer, and a conductive material layer located in and on a top surface of the upper electrode conductive layer.

Herein, the upper and the lower electrode conductive layers in the first, the second and the third sub-memory structures are connected with each other to form a complete upper and lower electrode layer;
  the dielectric layers in the first, the second and the third sub-memory structures are connected with each other to form a complete dielectric layer.

In some embodiments, the transistor further includes: a source and a drain respectively disposed at both ends of the semiconductor body in the first direction.

In some embodiments, the semiconductor structure further includes a plurality of bit lines;
  each of the bit lines is in direct contact with bottom surfaces of a plurality of semiconductor bodies.

In some embodiments, the conductive pillars are formed by epitaxial growth; the memory structures are formed at least by selective deposition.

Embodiments of the disclosure further provide a memory, the memory includes a semiconductor structure as described in any of the above-described various embodiments of the disclosure.

The protection scope of the embodiments of the present disclosure is not limited to this. Any change and replacement is easily to think within the technical scope of the embodiments of the present by those skilled in the art, and fall with the protection scope of the present disclosure. Therefore, the scope of protection of the embodiments of the present disclosure shall be subject to the scope of protection of the claims.

What is claimed is:

1. A semiconductor structure, comprising:
a plurality of transistors located in a semiconductor layer; each of the transistors comprising a semiconductor body extending in a first direction and a gate structure covering at least one side surface of the semiconductor body; the first direction being a thickness direction of the semiconductor layer;
a plurality of conductive pillars, each of the conductive pillars being located on a top surface of a corresponding semiconductor body and being in direct contact with the corresponding semiconductor body, wherein each of the conductive pillars comprises three sub-conductive pillars stacked along the first direction including a first sub-conductive pillar located on the top surface of the corresponding semiconductor body, a second sub-conductive pillar located on a top surface of the first sub-conductive pillar, and a third sub-conductive pillar located on a top surface of the second sub-conductive pillar, wherein the first sub-conductive pillar, the second sub-conductive pillar and the third sub-conductive pillar are in direct contact; and
a memory structure covering the plurality of conductive pillars, the memory structure comprising three sub-memory structures stacked along the first direction including a first sub-memory structure covering sidewalls of the first sub-conductive pillar, a second sub-memory structure covering sidewalls of the second sub-conductive pillar, and a third sub-memory structure covering a top surface and sidewalls of the third sub-conductive pillar, the first sub-memory structure, the second sub-memory structure and the third sub-memory structure are in direct contact.

2. The semiconductor structure of claim 1,
wherein the first sub-memory structure comprises: a plurality of first lower electrode conductive layers covering sidewalls of corresponding first sub-conductive pillars, a plurality of first dielectric layers covering corresponding the lower electrode conductive layers, a first upper electrode conductive layer covering the plurality of first dielectric layers and a top surface of the semiconductor layer between two adjacent ones of the first dielectric layers, and a first conductive material layer and a first dielectric material layer stacked in sequence in the first upper electrode conductive layer;
wherein the second sub-memory structure comprises: a plurality of second lower electrode conductive layers covering sidewalls of corresponding second sub-conductive pillars, a plurality of second dielectric layers covering corresponding second lower electrode conductive layers, a second upper electrode conductive layer covering the plurality of second dielectric layers and a top surface of the first dielectric material layer, and a second conductive material layer and a second dielectric material layer stacked in sequence in the second upper electrode conductive layer;
wherein the third sub-memory structure comprises: a plurality of third lower electrode conductive layers covering sidewalls and top surfaces of corresponding third sub-conductive pillars, a plurality of third dielectric layers covering corresponding third lower electrode conductive layers, a third upper electrode conductive layer covering the plurality of third dielectric layers and a top surface of the second dielectric material layer, and a third conductive material layer located in and on a top surface of the third upper electrode conductive layer;
wherein the first upper electrode conductive layer, the second upper electrode conductive layer and the third upper electrode conductive layer are connected with each other to form a complete upper electrode conductive layer; and a first lower electrode conductive layer, a second lower electrode conductive layer and a third lower electrode conductive layer are connected with each other to form a complete lower electrode conductive layer;
and wherein a first dielectric layer, a second dielectric layer and a third dielectric layer are connected with each other to form a complete dielectric layer.

3. The semiconductor structure of claim 1, wherein a transistor further comprises: a source and a drain respectively disposed at two ends of the semiconductor body in the first direction.

4. The semiconductor structure of claim 1, wherein the semiconductor structure further comprises: a plurality of bit lines;
and wherein each of the bit lines is in direct contact with bottom surfaces of a plurality of semiconductor bodies.

5. The semiconductor structure of claim 1, wherein the conductive pillars are formed by epitaxial growth, and the memory structure is formed at least by selective deposition.

6. A memory comprising the semiconductor structure according to claim 1.

7. A method for manufacturing a semiconductor structure, comprising:
providing a semiconductor layer;
forming a plurality of transistors in the semiconductor layer; each of the transistors comprising a semiconductor body extending in a first direction and a gate structure covering at least one side surface of the semiconductor body; the first direction being a thickness direction of the semiconductor layer;
forming conductive pillars on exposed top surfaces of corresponding semiconductor bodies; and
forming a memory structure covering the conductive pillars;
wherein each of the conductive pillars comprises three sub-conductive pillars stacked along the first direction and the memory structure comprises three sub-memory structures stacked along the first direction, and the conductive pillars and the memory structure are formed by:
forming first sub-conductive pillars on an exposed top surfaces of corresponding semiconductor bodies;
forming a first sub-memory structure covering the first sub-conductive pillars;
forming second sub-conductive pillars on exposed top surfaces of corresponding first sub-conductive pillars; a corresponding first sub-conductive pillar being in direct contact with a corresponding second sub-conductive pillar;
forming a second sub-memory structure covering the second sub-conductive pillars; the second sub-memory structure being in direct contact with the first sub-memory structure;
forming third sub-conductive pillars on exposed top surfaces of corresponding second sub-conductive pillars; a corresponding third sub-conductive pillar being in direct contact with a corresponding second sub-conductive pillar; and forming a third sub-memory structure covering the third sub-conductive pillars; the third sub-memory structure being in direct contact with the second sub-memory structure.

8. The method of claim 7, wherein the forming a first sub-memory structure covering first sub-conductive pillars comprises:
   forming a plurality of first lower electrode conductive layers covering top surfaces and sidewalls of corresponding first sub-conductive pillars by selective deposition;
   forming a plurality of first dielectric layers covering corresponding first lower electrode conductive layers by selective deposition; a first gap being formed between two adjacent ones of the first dielectric layers; and
   forming a first upper electrode conductive layer covering the plurality of first dielectric layers and bottoms of a plurality of first gaps.

9. The method of claim 8, further comprising:
   before the forming a second sub-conductive pillar on an exposed top surface of each of the first sub-conductive pillars, forming a first conductive material layer and a first dielectric material layer sequentially in the plurality of first gaps where the first upper electrode conductive layer is formed; and
   removing the first lower electrode conductive layers, the first dielectric layers and the first upper electrode conductive layer on top surfaces of the first sub-conductive pillars to expose the top surfaces of the first sub-conductive pillars; wherein a top surface of the first dielectric material layer is substantially flush with an exposed top surface of the first sub-conductive pillar.

10. The method of claim 9, wherein a material of a conductive pillar is the same as or different from a material of the first conductive material layer.

11. The method of claim 9, wherein the forming a second sub-memory structure covering second sub-conductive pillars comprises:
   forming a plurality of second lower electrode conductive layers covering top surfaces and sidewalls of corresponding second sub-conductive pillars by selective deposition;
   forming a plurality of second dielectric layers covering corresponding second lower electrode conductive layers by selective deposition; a second gap being formed between two adjacent ones of the second dielectric layers; and
   forming a second upper electrode sub-conductive layer covering the plurality of second dielectric layers and bottoms of a plurality of second gaps; the second upper electrode conductive layer being in direct contact with the first upper conductive layer.

12. The method of claim 11, further comprising:
   before the forming a third sub-conductive pillar on an exposed top surface of each of the second sub-conductive pillars, forming a second conductive material layer and a second dielectric material layer sequentially in the plurality of second gaps where the second upper electrode conductive layer is formed; and
   removing the second lower electrode conductive layers, the second dielectric layers and the second upper electrode conductive layer on top surfaces of the second sub-conductive pillars to expose the top surfaces of the second sub-conductive pillars; wherein a top surface of the second dielectric material layer is substantially flush with an exposed top surface of the second upper electrode conductive pillar.

13. The method of claim 11, wherein the forming a third sub-memory structure covering third sub-conductive pillars comprises:
   forming a plurality of third lower electrode conductive layers covering top surfaces and sidewalls of corresponding third sub-conductive pillars by selective deposition;
   forming a plurality of third dielectric layers covering corresponding third lower electrode conductive layers by selective deposition; a third gap being formed between two adjacent ones of the third dielectric layers; and
   forming a third upper electrode conductive layer covering the plurality of third dielectric layers and bottoms of a plurality of third gaps;
   wherein the method further comprises:
   forming a third conductive material layer in the plurality of third gaps where the third upper electrode conductive layer is formed and on a top of the third upper electrode conductive layer;
   wherein the first upper electrode conductive layer, the second upper electrode conductive layer and the third upper electrode conductive layer are connected with each other to form a complete upper electrode conductive layer; and a first lower electrode conductive layer, a second lower electrode conductive layer and a third lower electrode conductive layer are connected with each other to form a complete lower electrode conductive layer; and
   wherein a first dielectric layer, a second dielectric layer and a third dielectric layer are connected with each other to form a complete dielectric layer.

14. The method of claim 7, wherein the forming a plurality of transistors in the semiconductor layer comprises:
   etching the semiconductor layer from a surface of the semiconductor layer in the first direction to form the semiconductor body of a transistor;
   forming the gate structure of the transistor on at least one side surface of the semiconductor body; and
   forming a source and a drain of the transistor respectively at opposite ends of the semiconductor body along the first direction.

15. The method of claim 7, further comprising:
   forming a plurality of bit lines in the semiconductor layer, wherein each of the bit lines is in direct contact with bottom surfaces of a plurality of semiconductor bodies.

* * * * *